United States Patent
Gaade (10) Patent No.: US 10,069,637 B2
(45) Date of Patent: Sep. 4, 2018

(54) TRANSMITTER CIRCUIT HARVESTING POWER FROM POWER SUPPLY OF A RECEIVER CIRCUIT

(71) Applicant: Lattice Semiconductor Corporation, Portland, OR (US)

(72) Inventor: Dayasagar Reddy Gaade, Hyderabad (IN)

(73) Assignee: Lattice Semiconductor Corporation, Portland, OR (US)

( * ) Notice: Subject to any disclaimer, the term of this patent is extended or adjusted under 35 U.S.C. 154(b) by 0 days.

(21) Appl. No.: 15/255,915

(22) Filed: Sep. 2, 2016

(65) Prior Publication Data
US 2018/0069712 A1    Mar. 8, 2018

(51) Int. Cl.
H04L 25/00  (2006.01)
H04L 12/10  (2006.01)
H03K 3/356  (2006.01)
H03L 7/06   (2006.01)

(52) U.S. Cl.
CPC ......... *H04L 12/10* (2013.01); *H03K 3/35613* (2013.01); *H03L 7/06* (2013.01)

(58) Field of Classification Search
CPC ............ H04L 25/0272; H04L 25/0292; H03K 19/0005; H04B 1/0458
USPC .... 375/257, 295, 297; 327/534, 109, 63, 94, 327/96; 330/261, 252
See application file for complete search history.

(56) References Cited

U.S. PATENT DOCUMENTS

| | | | |
|---|---|---|---|
| 7,701,262 B2 * | 4/2010 | Kim | H03K 19/0016 326/21 |
| 8,363,705 B2 | 1/2013 | Tang et al. | |
| 8,638,125 B2 | 1/2014 | Abugharbieh et al. | |
| 8,884,655 B2 | 11/2014 | Mukherjee et al. | |
| 2012/0019194 A1 * | 1/2012 | Krauer | B60L 3/0069 320/107 |
| 2012/0049960 A1 * | 3/2012 | Hsu | H03F 3/45237 330/261 |

(Continued)

OTHER PUBLICATIONS

Demirdag, et al., "A 66-mW 3.4Gbps Transmitter PHY for HDMI Applications in 2.5V 40-nm CMOS," Synopsys, Inc., Mississauga, Canada, Gdansk, Poland, http://www.design-reuse.com/articles/22347/transmitter-phy-hdmit.html, Jan. 4, 2010.

(Continued)

*Primary Examiner* — Khai Tran
(74) *Attorney, Agent, or Firm* — Haynes and Boone, LLP (57) ABSTRACT

A transmitter (TX) circuit harvesting power from a power supply of a receiver (RX) circuit is disclosed herein. The TX circuit for data transmission over a differential channel comprises a driver circuit coupled with the differential channel across a first pair of resistors. One terminal of each resistor of the first pair coupled together at a common mode voltage node. The differential channel is series terminated at the RX circuit by a second pair of resistors to a power supply node of the RX circuit. The driver circuit includes a differential pair and a current source drawing current from the power supply node of the RX circuit. A pre-driver circuit coupled with the driver circuit provides an output of the pre-driver circuit as an input to the driver circuit. At least the pre-driver circuit is powered from the common mode voltage node of the driver circuit.

20 Claims, 7 Drawing Sheets

(56) References Cited

U.S. PATENT DOCUMENTS

2013/0120029 A1* 5/2013 Li ...................... H04L 25/0286
  327/109

OTHER PUBLICATIONS

Gupta et al., "Zero Power 4.95Gbps HDMI Transmitter," IEEE, 2014, pp. 1500-1503, STMicroelectronics Pvt. Ltd., Great Noida, India.

* cited by examiner

TRANSMITTER CIRCUIT HARVESTING POWER FROM POWER SUPPLY OF A RECEIVER CIRCUIT

TECHNICAL FIELD

The embodiments of the present disclosure are generally directed to the field of data transmission, and more particularly, to a data transmitter circuit that harvests power from power supply of a receiver circuit.

BACKGROUND

Typically, a data transmission system may include differential signaling for transmission of serial data from a transmitter (TX) circuit to a receiver (RX) circuit. Such a transmission of serial data may be performed over a differential channel, through a high definition interface, such as a High-Definition Multimedia Interface (HDMI), a Mobile High-Definition Link (MHL), Display Port, Universal Serial Bus (USB), and the like. In certain scenarios, the TX circuit may correspond to a portable device, such as a laptop and a mobile phone, which is powered through an internal battery. Further, the RX circuit may correspond to a non-portable or wall-mounted device, such as a television (TV), a monitor, or other such display device, which is powered through an external power socket.

In such a data transmission system, the overall power consumption correspond to a combined power consumption in the TX circuit and the RX circuit. Generally, the receiver circuit consumes more power, such as 70 to 80 mW, which is about three to four times larger, than the power consumed by the transmitter circuit, such as 20 to 30 mW per channel. The transmitter circuit includes various internal circuitries, such as a data serializer circuit, a phase locked loop (PLL) circuit, a pre-driver circuit, and a common mode logic (CML)-based driver circuit. The driver circuit, terminated to the RX circuit supply, consumes power from the power supply of the RX circuit.

Currently, various techniques are utilized for designing the transmitter circuit that consumes less power. In accordance with one of such techniques, a low-power transmitter circuit has been designed that uses an external 1V core power supply for the pre-driver circuit, which results in an multi-fold increase in the differential switching pair area and current source area in the corresponding driver circuit due to limited headroom compared to when the pre-driver is powered from a 3.3V IO supply. Further, the increase in the differential pair area and the current source area of the driver circuit leads to large capacitance on the input and common source node of the differential pair in the driver circuit, resulting in reduction of speed of operation and a large dynamic leakage of the tail current of the driver circuit, thereby reducing effective current in the driver circuit. In such a technique, power consumption by the pre-driver circuit is reduced due to the utilization of external 1V core power supply; however, there is a speed penalty and the power consumption by the driver circuit is substantially increased from the power supply of the RX circuit for the same output swing levels.

In accordance with another technique, the pre-driver circuit uses the external 1V core power supply and an AC coupling capacitor that is used to couple the pre-driver circuit output to the input common mode voltage of the driver circuit. This technique results in better headroom, however the use of the AC coupling capacitor adds parasitic capacitance loading on the output of the pre-driver circuit, thereby loading the pre-driver circuit and hence resulting in higher power consumption and lower speed.

In accordance with yet another technique, the transmitter circuit uses a common source node of the driver circuit as the power supply for the pre-driver circuit and other preceding circuitries, such as the data serializer circuit, of the transmitter circuit. However, this technique adds a substantial capacitance on the common source node of the driver circuit. The added capacitance on the common source node results in the reduction of the output impedance of the current source, leading to degradation in the quality and speed of the CML switching at the output of the driver circuit.

In accordance with yet another technique, the transmitter circuit may utilize external 3.3V power supply to provide sufficient margin on the driver circuit instead of external 1V core power supply. Due to the usage of the external 3.3V power supply in the TX circuit for pre-driver circuit, the driver circuit operates with sufficient headroom, but the pre-driver circuit current consumption increases. In such a case, usually the pre-driver circuitries consumes approximately 70 to 80 percent of the total power consumed by the transmitter circuit.

Further limitations and disadvantages of conventional and traditional approaches will become apparent to those skilled in the art, through a comparison of the described systems with some aspects of the present disclosure, as set forth in the remainder of the present application and with reference to the drawings.

SUMMARY

Aspects of the disclosure are directed to transmitter (TX) circuit that harvests power from power supply of a receiver (RX) circuit, devices including such transmitter circuits, and methods of using such circuits.

In accordance with a first aspect, a TX circuit for data transmission over a differential channel is disclosed. The TX circuit includes a driver circuit coupled with the differential channel across a first pair of resistors. One terminal of each resistor of the first pair are coupled together at a common mode voltage node. The differential channel is series terminated at a RX circuit by a second pair of resistors to a power supply node of the RX circuit. The driver circuit includes a differential pair that draws current from the power supply node of the RX circuit. The TX circuit further includes a pre-driver circuit coupled with the driver circuit to provide an output of the pre-driver circuit as an input to the driver circuit, wherein at least the pre-driver circuit is powered from the common mode voltage node of the driver circuit.

In accordance with a second aspect, a system comprising a TX circuit configured to transmit data to a RX circuit is disclosed. The TX circuit includes a driver circuit coupled with the differential channel across a first pair of resistors, one terminal of each resistor of the first pair coupled together at a common mode voltage node. The differential channel is series terminated at the RX circuit by a second pair of resistors to a power supply node of the RX circuit. The driver circuit includes a differential pair that draws current from the power supply node of the RX circuit. The TX circuit further includes a pre-driver circuit coupled with the driver circuit to provide an output of the pre-driver circuit as an input to the driver circuit. At least the pre-driver circuit is powered from the common mode voltage node of the driver circuit. The TX circuit further includes a data serializer circuit that is supplied from the common mode voltage node of the driver circuit or an external low voltage core power supply. The TX circuit further includes a PLL circuit that generates a clock for the data serializer circuit is supplied from the common mode voltage node of the driver circuit or the external low voltage core power supply. The RX circuit is configured to receive the data transmitted by the TX circuit and provide the current from the power supply node to the driver circuit through the differential channel.

In accordance with a third aspect, a method of powering a TX circuit is disclosed. The method includes receiving, by a driver circuit in the transmitter circuit, current from a power supply of a RX circuit, the RX circuit coupled to the driver circuit by a differential channel, wherein one side of the differential channel is coupled through a first pair of resistors to a common mode voltage node of the driver circuit. The differential channel is series terminated by a second pair of resistors at the RX circuit to a power supply node. The method further includes powering, by the driver circuit, at least a pre-driver circuit from the common mode voltage node. The method further includes operating the pre-driver circuit as a common source amplifier. The method further includes outputting a signal from the pre-driver circuit to the input of the driver circuit.

In accordance with a fourth aspect, an apparatus for harvesting power in a TX circuit from power supply of a RX circuit is disclosed. The apparatus includes one or more driver and pre-driver Current Mode Logic (CML) circuitries in the TX circuit. A common mode voltage node of each driver circuit is used as a power supply at least for a corresponding pre-driver circuit. The TX circuit corresponds to a battery operated portable electronic device and the RX circuit corresponds to a non-portable electronic device powered by an external power supply.

BRIEF DESCRIPTION OF THE DRAWINGS

Aspects of the disclosure are illustrated by way of examples, not by way of limitation, in the figures of the accompanying drawings in which like reference numerals refer to similar elements.

DETAILED DESCRIPTION OF THE ILLUSTRATED EMBODIMENTS

Aspects of the disclosure are directed to a transmitter (TX) circuit that harvests power from power supply of a receiver (RX) circuit.

In accordance with a first aspect, a TX circuit for data transmission over a differential channel is disclosed. The TX circuit includes a driver circuit coupled with the differential channel across a first pair of resistors, one terminal of each resistor of the first pair coupled together at a common mode voltage node. The differential channel is series terminated at a RX circuit by a second pair of resistors to a power supply node of the RX circuit. The driver circuit includes a differential pair that draws current from the power supply node of the RX circuit. The TX circuit further includes a pre-driver circuit coupled with the driver circuit to provide an output of the pre-driver circuit as an input to the driver circuit, wherein at least the pre-driver circuit is powered from the common mode voltage node of the driver circuit. The TX circuit further includes a data serializer circuit that is supplied from the common mode voltage node of the driver circuit or an external low voltage core power supply. The TX circuit further includes a phase locked loop (PLL) circuit that generates a clock for the data serializer circuit is supplied from the common mode voltage node of the driver circuit or an external low voltage core power supply.

In accordance with an embodiment, the driver circuit and the pre-driver circuit may be based on Current Mode Logic (CML) and the common mode voltage node is a low impedance node. The differential pair in the driver circuit may include two transistors in a common source configuration and a current source operable in saturation. The pre-driver circuit may include a constant tail current source that stabilizes voltage at the common mode voltage node of the driver circuit.

In accordance with an embodiment, an input common mode voltage of the driver circuit may be increased to a first voltage value when the pre-driver circuit is powered from the common mode voltage node of the driver circuit, in comparison with a second voltage value when the pre-driver circuit is powered from the external low voltage core power supply. This may increase speed and reduce dynamic leakage current of the driver circuit. The first voltage value corresponds to a difference between terminal voltage of the RX circuit and voltage drop across a plurality of resistors in the RX circuit, the driver circuit, and the pre-driver circuit due to terminal current provided from the power supply node of the RX circuit. The second voltage value corresponds to a difference between the external low voltage core power supply and voltage drop across resistors of the pre-driver circuit.

In accordance with an embodiment, the TX circuit may further include a regulator circuit or a large decoupling capacitor, coupled to the common mode voltage node of the driver circuit. The regulator circuit or the large decoupling capacitor may provide stable and controlled power supply to one or more CMOS-based switching circuitries of the TX circuit. The one or more CMOS-based switching circuitries may correspond to the PLL circuit, the data serializer circuit, and a CMOS-based pre-driver circuit.

In accordance with an embodiment, the pre-driver circuit may be powered by the common mode voltage node of the driver circuit when high voltage level (VOH) specification of the output of the driver circuit is within a predefined margin associated with a first operating mode. In accordance with an embodiment, the pre-driver circuit may be powered from an external low voltage core power supply when the first pair of resistors is disconnected and the high voltage level (VOH) specification of the output of the driver circuit is outside a predefined margin associated with a second operating mode.

In accordance with an embodiment, a maximum voltage drop across the differential resistors of the pre-driver circuit may result in the VOH that satisfies standard protocols of one or more high-definition device interfaces between the TX circuit and the RX circuit.

In accordance with a second aspect, a system comprising a TX circuit configured to transmit data to a RX circuit is disclosed. The TX circuit includes a driver circuit coupled with the differential channel across a first pair of resistors, one terminal of each resistor of the first pair coupled together at a common mode voltage node. The differential channel is series terminated at the RX circuit by a second pair of resistors to a power supply node of the RX circuit. The driver circuit includes a differential pair that draws current from the power supply node of the RX circuit. The TX circuit further includes a pre-driver circuit coupled with the driver circuit to provide an output of the pre-driver circuit as an input to the driver circuit. At least the pre-driver circuit is powered from the common mode voltage node of the driver circuit. The TX circuit further includes a data serializer circuit that is supplied from the common mode voltage node of the driver circuit or an external low voltage core power supply. The TX circuit further includes a PLL circuit that generates a clock for the data serializer circuit is supplied from the common mode voltage node of the driver circuit or the external low voltage core power supply. The RX circuit is configured to receive the data transmitted by the TX circuit and provide the current from the power supply node to the driver circuit through the differential channel.

In accordance with an embodiment, the TX circuit may include a first switch and a second switch, connected across the first pair of resistors, configured in an ON state. The TX circuit may further include a third switch, connected across the pre-driver circuit and the external low voltage core power supply, configured in an OFF state. The first, second and third switches may be configured in the respective states to power the pre-driver circuit by the common mode voltage node of the driver circuit when the VOH specification of the output of the driver circuit is within a predefined margin associated with a first operating mode.

In accordance with an embodiment, the first switch and the second switch, connected across the first pair of resistors, may be configured in an OFF state. The third switch, connected across the pre-driver circuit and the external low voltage core power supply, may be configured in an ON state. The first, second and third switches may be configured in the respective states to power the pre-driver circuit from the external low voltage core power supply when the VOH specification of the output of the driver circuit is outside a predefined margin associated with a second operating mode.

In accordance with a third aspect, a method of powering a TX circuit is disclosed. The method includes receiving, by a driver circuit in the transmitter circuit, current from a power supply of a RX circuit. The RX circuit is coupled to the driver circuit by a differential channel, wherein one side of the differential channel is coupled through a first pair of resistors to a common mode voltage node of the driver circuit. The differential channel is series terminated by a second pair of resistors at the RX circuit to a power supply node. The method further includes powering, by the driver circuit, at least a pre-driver circuit from the common mode voltage node. The method further includes operating the pre-driver circuit as a common source amplifier. The method further includes outputting a signal from the pre-driver circuit to the input of the driver circuit.

In accordance with a fourth aspect, an apparatus for harvesting power in a TX circuit from power supply of a RX circuit is disclosed. The apparatus includes one or more driver and pre-driver Current Mode Logic (CML) circuitries in the TX circuit. A common mode voltage node of each driver circuit is used as a power supply at least for a corresponding pre-driver circuit. The TX circuit corresponds to a battery operated portable electronic device and the RX circuit corresponds to a non-portable electronic device powered by an external power supply.

Figure 1A:
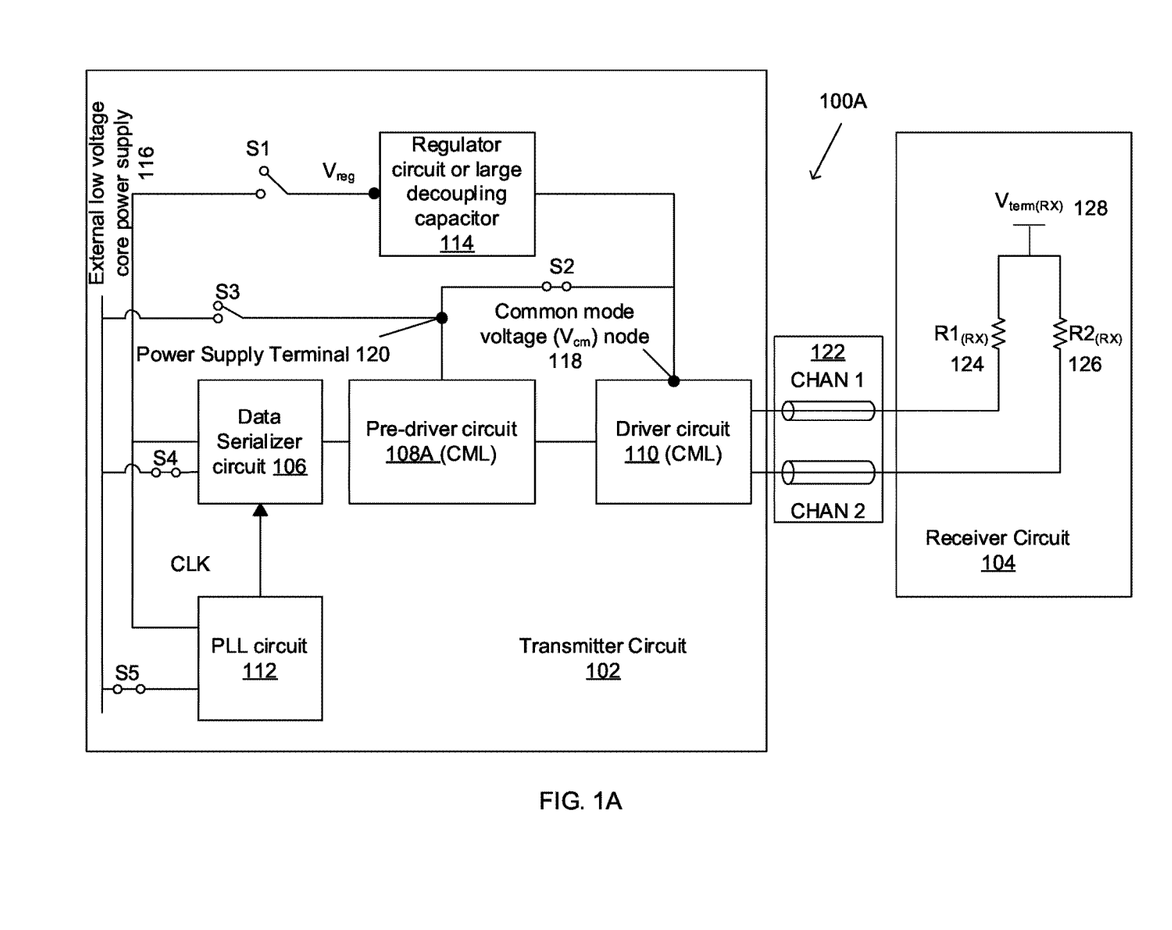
FIGS. 1A and 1B illustrate block diagrams of a data transmission system that includes a transmitter circuit and a receiver circuit, in accordance with an embodiment of the present disclosure.
Figure 1B:
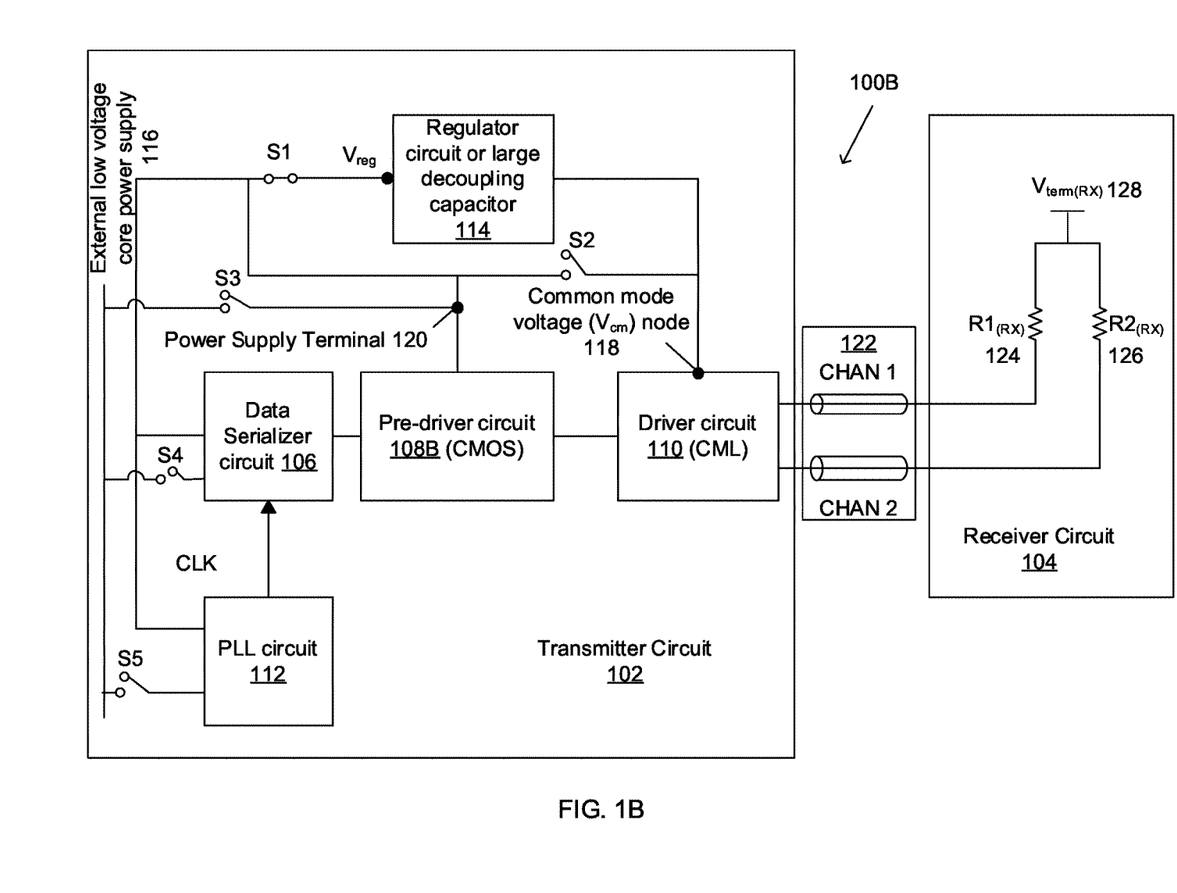

FIGS. 1A and 1B illustrate block diagrams of a data transmission system that includes a transmitter circuit and a receiver circuit, in accordance with an embodiment of the present disclosure. With reference to FIG. 1A, there is shown a data transmission system 100A that includes a Transmitter (TX) circuit 102 and a Receiver (RX) circuit 104. The TX circuit 102 further includes a plurality of circuitries used for operation of the data transmission system 100A. The plurality of circuitries may include a data serializer circuit 106, a pre-driver circuit 108A, a driver circuit 110, and a Phase Locked Loop (PLL) circuit 112. The pre-driver circuit 108A and the driver circuit 110 are based on Current Mode Logic (CML). The TX circuit 102 further includes a regulator circuit or a large decoupling capacitor 114. There is further shown an external low voltage core power supply 116, a common mode voltage ($V_{cm}$) node 118, a power supply terminal 120 of the pre-driver circuit 108A, and a plurality of switches, such as S1 to S5. A differential channel 122 is shown as CHAN1 and CHAN2 between the TX circuit 102 and the RX circuit 104. The RX circuit 104 includes a pair of terminal resistors $R1_{(RX)}$ 124 and $R2_{(RX)}$ 126, and a power supply node ($V_{term(RX)}$) 128. For brevity, there is shown only one instance of each of the plurality of circuitries. However, the disclosure may not be so limited, and multiple instances of such plurality of circuitries may be implemented (illustrated in FIGS. 3 and 4) without any deviation from the scope of the disclosure.

With reference to FIG. 1A, the TX circuit 102 in the data transmission system 100A includes the driver circuit 110 coupled with the differential channel 122 across a first pair of resistors (not shown). The TX circuit 102 may be a battery operated portable electronic device, such as a laptop or a mobile phone, or an HDMI compatible transmitter, operable to harvest power from a power supply of the RX circuit 104. The RX circuit 104 may be a non-portable electronic device, such as a television (TV), a monitor, or a display, which may be powered by external power supply. One terminal of each resistor of the first pair in the driver circuit 110 may be coupled together at the $V_{cm}$ node 118. The differential channel 122 is series terminated at the RX circuit 104 by the pair of terminal resistors $R1_{(RX)}$ 124 and $R2_{(RX)}$ 126 to the $V_{term(RX)}$ 128 of the RX circuit 104. The driver circuit 110 may include a differential pair (not shown) that draws current from the $V_{term(RX)}$ 128 of the RX circuit 104. The pre-driver circuit 108A may be coupled with the driver circuit 110 such that an output of the pre-driver circuit 108A is provided as an input to the driver circuit 110. The pre-driver circuit 108A may be powered from the $V_{cm}$ node 118 of the driver circuit 110. The data serializer circuit 106 may be supplied current from the $V_{cm}$ node 118 of the driver circuit 110 or the external low voltage core power supply 116. The PLL circuit 112 may generate a clock for the data serializer circuit 106 and may be supplied from the $V_{cm}$ node 118 of the driver circuit 110 or the external low voltage core power supply 116.

In accordance with an embodiment, a first block diagram of the TX circuit 102 may be implemented based on a first configuration of the plurality of switches S1 to S5. The first configuration of the plurality of switches S1 to S5 is illustrated below:

S1=OFF;
S2=ON;
S3=OFF;
S4=ON;
S5=ON.

In accordance with the first configuration of the plurality of switches S1 to S5, the $V_{cm}$ node 118 of the driver circuit 110 may be utilized as the power supply of the pre-driver circuit 108A. The pre-driver circuit 108A may be powered by the $V_{cm}$ node 118 of the driver circuit 110 when the high voltage level (VOH) specification of the output of the driver circuit 110 is within a predefined margin associated with a first operating mode. In an exemplary scenario, the first operating mode may correspond to a data rate of the driver circuit 110 in the TX circuit 102 that exceeds a predetermined threshold value for a high-definition device interface with a pre-defined specification, such as HDMI2.0.

In accordance with an alternative embodiment, the first block diagram of the TX circuit 102 may be implemented based on a second configuration of the plurality of switches S1 to S5. The second configuration of the plurality of switches S1 to S5 is illustrated below:

S1=OFF;
S2=OFF;
S3=ON;
S4=ON;
S5=ON.

In accordance with the second configuration of the plurality of switches S1 to S5, the external low voltage core power supply 116 may be utilized as the power supply of the pre-driver circuit 108A. The pre-driver circuit 108A may be powered by the external low voltage core power supply 116 when the first pair of resistors (not shown) are disconnected and the VOH specification of the output of the driver circuit 110 is outside a predefined margin associated with a second operating mode. In an exemplary scenario, the second operating mode may correspond to a data rate of the driver circuit 110 in the TX circuit 102 that is below the predetermined threshold value for a high-definition device interface with a pre-defined specification, such as HDMI1.4.

With reference to FIG. 1B, there is shown another data transmission system 100B that includes the TX circuit 102 and the RX circuit 104. In FIG. 1B, the TX circuit 102 further includes a plurality of circuitries, similar to the ones, as described above in FIG. 1A, except for the pre-driver circuit 108A. In FIG. 1B, the pre-driver circuit 108B is based on complementary metal-oxide semiconductor (CMOS) switching inverter. The connections between the plurality of circuitries are also similar to ones, as described in FIG. 1A. In accordance with an embodiment, the data serializer circuit 106 and the PLL circuit 112 may be implemented by CMOS-based switching circuitries.

In accordance with an embodiment, a second block diagram of the TX circuit 102 may be implemented based on a configuration of the plurality of switches S1 to S5. The second block diagram of the TX circuit 102 may correspond to a zero-power transmitter without any external power supply, such as the external low voltage core power supply 116. The configuration of the plurality of switches S1 to S5 is illustrated below:

S1=ON;
S2=OFF;
S3=OFF;
S4=OFF;
S5=OFF.

In accordance with the configuration of the plurality of switches S1 to S5, a stable and controlled power supply, such as $V_{reg}$, may be provided to one or more CMOS-based switching circuitries of the TX circuit 102. Examples of the one or more CMOS-based switching circuitries may correspond to the PLL circuit 112, the data serializer circuit 106, and the pre-driver circuit 108B. The stable and controlled power supply may be provided by the regulator circuit or a large decoupling capacitor 114 coupled with the $V_{cm}$ node 118 of the driver circuit 110. In such a configuration, the regulator circuit or large decoupling capacitor 114 receives voltage input from the $V_{cm}$ node 118 of the driver circuit 110. The PLL circuit 112, the data serializer circuit 106, and the pre-driver circuit 108B may be powered by the stable and controlled power supply provided by the regulator circuit or the large decoupling capacitor 114 when the VOH specification of the output of the driver circuit 110 is within a predefined margin associated with a first operating mode of a high-definition device interface with a pre-defined specification, such as HDMI2.0.

In accordance with an alternative embodiment, instead of using switches S2 and S3, a 2:1 analog multiplexer that includes two input lines, one output line, and one selection line is used. The two input lines may be connected to the $V_{cm}$ node 118 and the external low voltage core power supply 116, respectively. Based on a state of the selection line, one of the two input lines may be selected. The state of the selection line may be based on the data rate of the driver circuit 110. Accordingly, one of the $V_{cm}$ node 118 and the external low voltage core power supply 116 may be selected to provide power supply to the power supply terminal 120 of the pre-driver circuit 108A. In an exemplary scenario, if the data rate of the driver circuit 110 is below the predetermined threshold value, the input line that corresponds to the external low voltage core power supply 116 is selected. Accordingly, the external low voltage core power supply 116 may be selected to provide power supply to the power supply terminal 120 of the pre-driver circuit 108A. Similarly, if the data rate of the driver circuit 110 is above the predetermined threshold value, the input line that corresponds to the $V_{cm}$ node 118 is selected. Accordingly, the $V_{cm}$ node 118 may be selected to provide power supply to the power supply terminal 120 of the pre-driver circuit 108A.

Figure 2A:
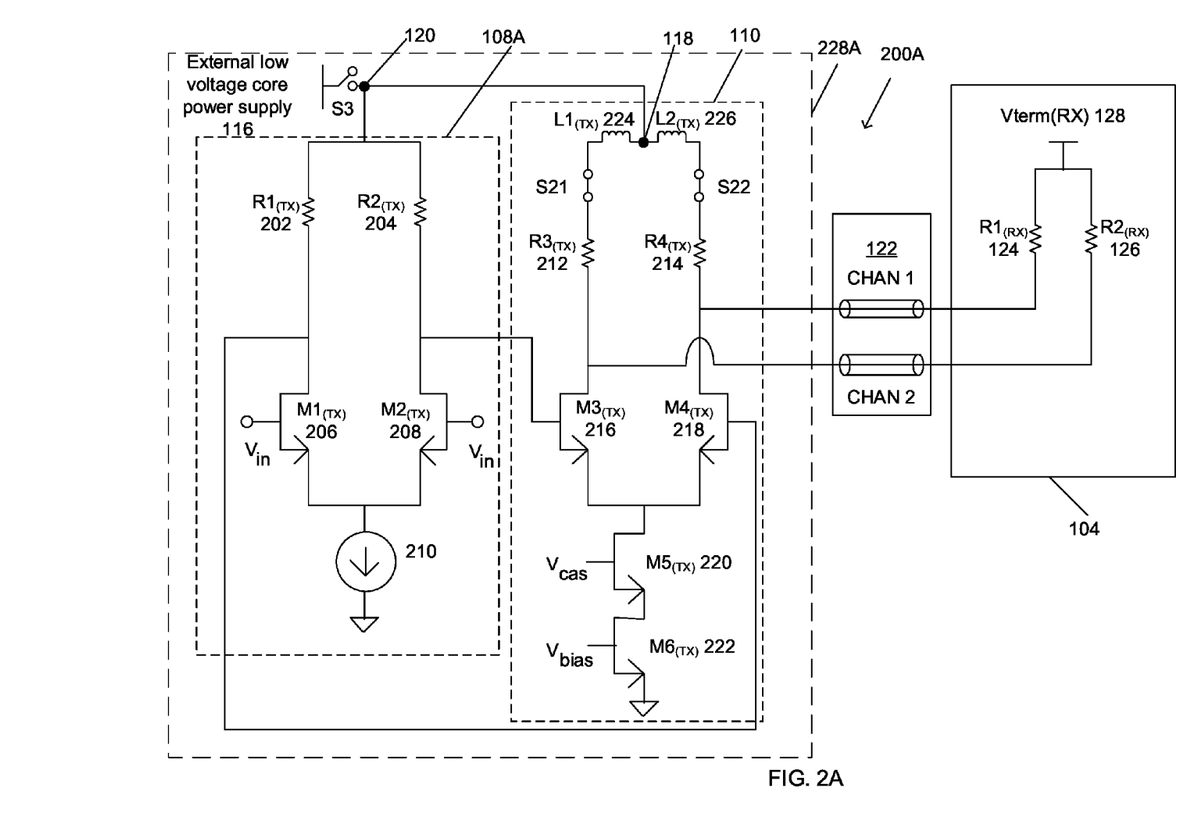
FIGS. 2A and 2B illustrate circuit diagrams of a pre-driver circuit and a driver circuit of a transmitter circuit, in accordance with an embodiment of the present disclosure.
Figure 2B:
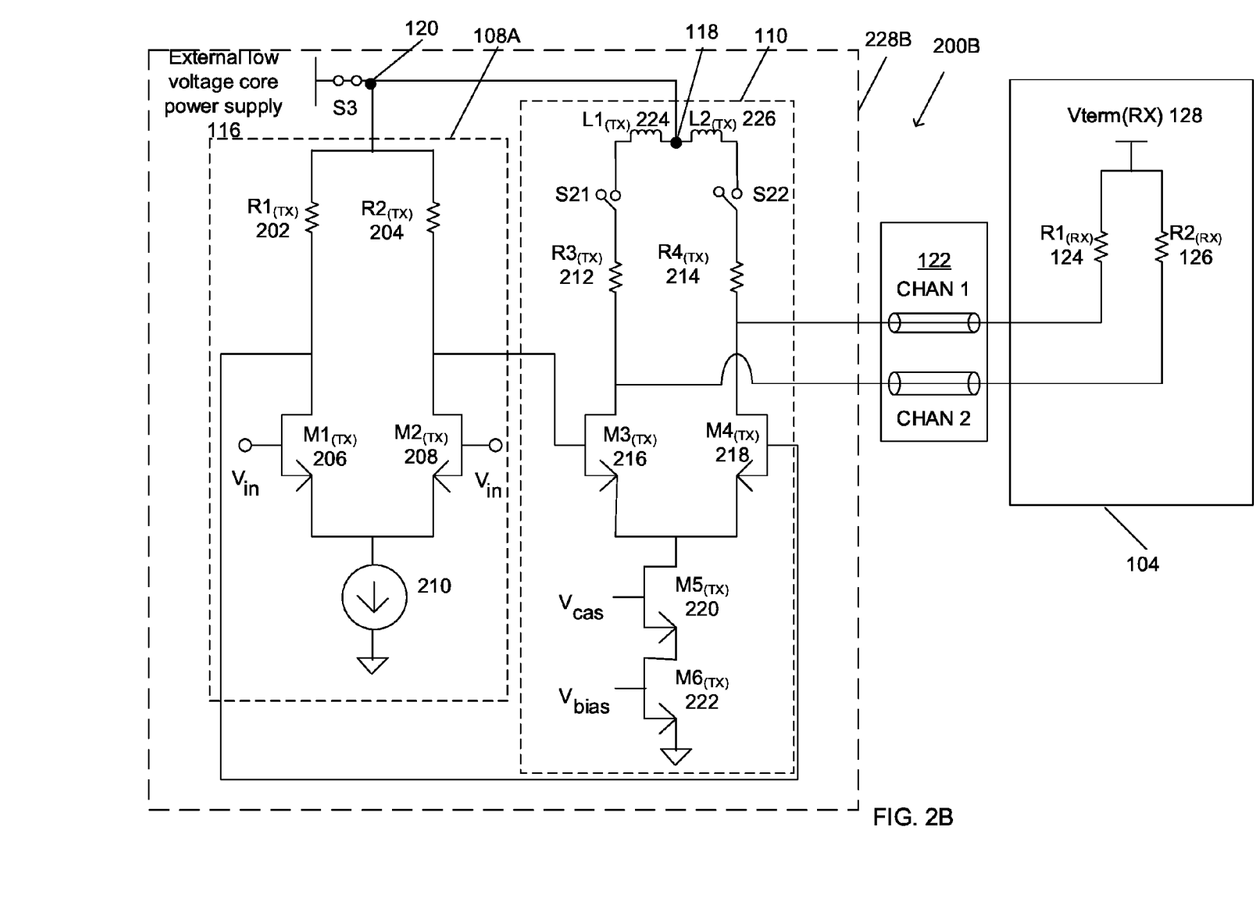

FIGS. 2A and 2B illustrate circuit diagrams of a pre-driver circuit and a driver circuit of a transmitter circuit, in accordance with an embodiment of the present disclosure. FIGS. 2A and 2B are explained in conjunction with FIGS. 1A and 1B. With reference to FIG. 2A, there is shown a data transmission system 200A that includes circuit diagram of the pre-driver circuit 108A and the driver circuit 110 in the TX circuit 102. Each of the pre-driver circuit 108A and the driver circuit 110 includes a differential pair that includes two transistors. The transistors $M1_{(TX)}$ 206 and $M2_{(TX)}$ 208 correspond to the differential pair of the pre-driver circuit 108A and the transistors $M3_{(TX)}$ 216 and $M4_{(TX)}$ 218 correspond to the differential pair of the driver circuit 110. In addition to the differential pair that includes two transistors $M3_{(TX)}$ 216 and $M4_{(TX)}$ 218, the driver circuit 110 includes two more transistors $M5_{(TX)}$ 220 and $M6_{(TX)}$ 222 as part of the cascoded current source for the driver circuit 110. Further, the pre-driver circuit 108A includes two load resistors $R1_{(TX)}$ 202 and $R2_{(TX)}$ 204 present in each branch of the differential pair comprising two transistors $M1_{(TX)}$ 206 and $M2_{(TX)}$ 208, respectively, of the pre-driver circuit 108A. The pre-driver circuit 108A may include a constant tail current source 210.

Further, the driver circuit 110 includes two load resistors R3$_{(TX)}$ 212 and R4$_{(TX)}$ 214 present in each branch of the differential pair comprising two transistors M3$_{(TX)}$ 216 and M4$_{(TX)}$ 218, respectively. There is further shown two inductors L1$_{(TX)}$ 224 and L2$_{(TX)}$ 226 connected in series with the load resistors R3$_{(TX)}$ 212 and R4$_{(TX)}$ 214, respectively to boost the high frequency signals. There is further shown a plurality of switches S3 (illustrated in FIGS. 1A and 1B), S21, and S22. Switches S21 and S22 are the bifurcated version of the switch S2 (illustrated in FIGS. 1A and 1B). The switches S21 and S22 may be present above each of the two load resistors R3$_{(TX)}$ 212 and R4$_{(TX)}$ 214, respectively, in each branch of the differential pair of the driver circuit 110. There is further shown the differential channel 122 ((as CHAN1 and CHAN2) between the TX circuit 102 and the RX circuit 104), the pair of terminal resistors R1$_{(RX)}$ 124 and R2$_{(RX)}$ 126, and the V$_{term(RX)}$ 128 in the RX circuit 104 (illustrated in FIGS. 1A and 1B). Further, there is shown the V$_{cm}$ node 118 in the driver circuit 110 that may be used to provide power supply to the pre-driver circuit 108A (illustrated in FIG. 1A). Furthermore, there is further shown the power supply terminal 120 of the pre-driver circuit 108A that may receive power supply either from the V$_{cm}$ node 118 of the driver circuit 110 or the external low voltage core power supply 116.

With reference to FIG. 2A, the driver circuit 110 may be coupled with the differential channel 122 across the load resistors R3$_{(TX)}$ 212 and R4$_{(TX)}$ 214 in the TX circuit 102. The load resistors R3$_{(TX)}$ 212 and R4$_{(TX)}$ 214 may correspond to a first pair of resistors. One terminal of each of the load resistors R3$_{(TX)}$ 212 and R4$_{(TX)}$ 214 may be coupled together at the V$_{cm}$ node 118 of the driver circuit 110. The differential channel 122 is series terminated at the RX circuit 104 by the pair of terminal resistors R1$_{(RX)}$ 124 and R2$_{(RX)}$ 126 to the V$_{term(RX)}$ 128 of the RX circuit 104. The pair of terminal resistors R1$_{(RX)}$ 124 and R2$_{(RX)}$ 126 may correspond to a second pair of resistors. The two differential transistors M3$_{(TX)}$ 216 and M4$_{(TX)}$ 218 draws current from the V$_{term(RX)}$ 128 of the RX circuit 104. The pre-driver circuit 108A may be coupled with the driver circuit 110 such that an output of the pre-driver circuit 108A is provided as an input to the driver circuit 110. The pre-driver circuit 108A is powered from the V$_{cm}$ node 118 of the driver circuit 110. The transistors M5$_{(TX)}$ 220 and M6$_{(TX)}$ 222 form a cascaded high impedance current source for the driver circuit 110 that is based on CML logic. The two inductors L1$_{(TX)}$ 224 and L2$_{(TX)}$ 226 connected in series with the load resistors R3$_{(TX)}$ 212 and R4$_{(TX)}$ 214, respectively, are utilized to reduce the effect of capacitances at the output of the driver circuit 110. The utilization of the two inductors L1$_{(TX)}$ 224 and L2$_{(TX)}$ 226 is a standard technique of driving signals in a high-definition device interface.

In accordance with an embodiment, the two differential transistors M3$_{(TX)}$ 216 and M4$_{(TX)}$ 218 in the driver circuit 110 may be configured in a common source configuration and may include a current source that is operable in saturation. Further, the two differential transistors M1$_{(TX)}$ 204 and M2$_{(TX)}$ 208 in the pre-driver circuit 108A may also be configured in a common source configuration and the constant tail current source 210 is connected at a common node connecting the source terminals of the two differential transistors M1$_{(TX)}$ 204 and M2$_{(TX)}$ 208. The pre-driver circuit 108A may stabilize the voltage at the V$_{cm}$ node 118 of the driver circuit 110 due to the presence of the constant tail current source 210 in the pre-driver circuit 108A.

In accordance with an embodiment, a first circuit diagram of the pre-driver circuit 108A and the driver circuit 110 may be implemented based on a first configuration of the plurality of switches S3, S21, and S22. The first configuration of the plurality of switches S3, S21, and S22 is illustrated below:

S3=OFF;
S21=ON;
S22=ON

In accordance with the first configuration of the plurality of switches S3, S21, and S22, the V$_{cm}$ node 118 of the driver circuit 110 may be utilized as power supply of the pre-driver circuit 108A. Further, the combination of the pre-driver circuit 108A and the driver circuit 110 according to the first configuration is shown by a block 228A (illustrated in FIG. 2A). The input common mode voltage of the driver circuit 110 may correspond to a first voltage value when the V$_{cm}$ node 118 of the driver circuit 110 is used as power supply for the pre-driver circuit 108A. The first voltage value corresponds to a voltage difference between the V$_{term(RX)}$ 128 and sum of the voltage drops across one resistor of the pair of terminal resistors R1$_{(RX)}$ 124 and R2$_{(RX)}$ 124 present in the RX circuit 104, one load resistor of the two load resistors R3$_{(TX)}$ 212 and R4$_{(TX)}$ 214 present in each branch of the differential pair of the driver circuit 110, and one load resistor of the two load resistors R1$_{(TX)}$ 202 and R2$_{(TX)}$ 204 present in each branch of the differential pair of the pre-driver circuit 108A. The voltage drops across the above-mentioned resistors is due to a current provided by the V$_{term(RX)}$ 128 of the RX circuit 104. The first voltage value may be given by the following mathematical expression (1):

$$V_{first} = V_{term(RX)} - I_{drv}/2 * R1_{(RX)}120 + I_{pre-drv}/2 * (R1_{(RX)}120 + R4_{(TX)}214 + R2_{(TX)}204) \text{ or}$$

$$V_{first} = V_{term(RX)} - I_{drv}/2 * R1_{(RX)}120 + I_{pre-drv}/2 * (R2_{(RX)}122 + R3_{(TX)}212 + R1_{(TX)}202) \quad (1)$$

where,

V$_{first}$ corresponds to the first voltage value;

V$_{term(RX)}$ corresponds to the power supply V$_{term(RX)}$ 128 of the RX circuit 104;

I$_{drv}$ correspond to the current drawn by the driver circuit 110 cascoded current source;

I$_{pre-drv}$ correspond to the current drawn by the tail current source of the pre-driver circuit 108A from the V$_{cm}$ node 118;

R1$_{(RX)}$ 124 and R2$_{(RX)}$ 126 correspond to the terminal resistors of the RX circuit 104;

R3$_{(TX)}$ 212 and R4$_{(TX)}$ 214 correspond to the load resistors present in each branch of the differential pair of the driver circuit 110; and R1$_{(TX)}$ 202 and R2$_{(TX)}$ 204 correspond to the load resistors present in each branch of the differential pair of the pre-driver circuit 108A.

The input common mode voltage of the driver circuit 110 is same as the output common mode voltage of the pre-driver circuit 108A that drives the driver circuit 110 or provides a pre-emphasis or boosts the data signals. The data signals correspond to serialized output signals provided by the data serializer circuit 106, at the input of the pre-driver circuit 108A.

The pre-driver circuit 108A may be powered by the V$_{cm}$ node 118 of the driver circuit 110 when the VOH specification of the output of the driver circuit 110 is within a predefined margin associated with a first operating mode of a high-definition device interface with a pre-defined specification, such as HDMI2.0. Examples of such high-definition device interfaces include HDMI, MHL, USB, and the like. The pre-defined specifications, such as high voltage level (VOH) and low voltage level (VOL), of such high-definition device interfaces may correspond to associated protocols, such as HDMI 1.4, HDMI 2.0, HDMI 2.1, MHL2.0, MHL3.0, and the like, known in the prior art. The pre-defined specifications must be satisfied for an optimum operation of the TX circuit 102.

In accordance with an embodiment, the four differential transistors $M1_{(TX)}$ 204, $M2_{(TX)}$ 208, $M3_{(TX)}$ 214, and $M4_{(TX)}$ 218 may correspond to a type of metal-oxide semiconductor (MOS) transistors, such as NMOS transistors. However, a person with ordinary skills in the art would understand that the NMOS transistors are utilized only for exemplary purposes and should not be construed to limit the scope of the disclosure. Other types of transistors, such as PMOS transistors and bipolar junction transistors (BJTs) may also be utilized as the four differential transistors $M1_{(TX)}$ 204, $M2_{(TX)}$ 208, $M3_{(TX)}$ 214, and $M4_{(TX)}$ 218 in the TX circuit 102, without deviating from the scope of the disclosure. Nevertheless, the circuit design of the TX circuit 102 may be modified depending on the types of the four differential transistors implemented in the TX circuit 102.

In accordance with an embodiment, the four differential transistors $M1_{(TX)}$ 204, $M2_{(TX)}$ 208, $M3_{(TX)}$ 214, and $M4_{(TX)}$ 218 may correspond to the NMOS transistors. Typically, an NMOS transistor of a differential pair, to operate in saturation region, requires to satisfy the following conditions given in the following mathematical expressions (2) and (3):

$$V_{ds} > V_{gs} - V_{th} \quad (2)$$

$$V_d > V_g - V_{th} \text{ or } V_g < V_d + V_{th} \quad (3)$$

where, $V_{ds}$ corresponds to drain-to-source voltage of the NMOS transistor;

$V_{gs}$ corresponds to gate-to-source voltage of the NMOS transistor;

$V_{th}$ corresponds to the threshold voltage of the NMOS transistor;

$V_d$ corresponds to drain terminal voltage of the NMOS transistor; and $V_g$ corresponds to gate terminal voltage of the NMOS transistor.

In accordance with an embodiment, the one or more high-definition device interfaces of a pre-defined specification may be based on different standard protocols with corresponding VOH and VOL specifications. In accordance with the embodiment, the TX circuit 102 of the data transmission system 200A satisfies all the standard VOL specifications for one or more high-definition device interfaces. In accordance with an embodiment, common mode voltage at the $V_{cm}$ node 118 may be associated with the VOH and VOL, as given in the following mathematical expression (4):

$$V_{cm} = (VOH + VOL)/2 \quad (4)$$

where, "VOH" corresponds to the high voltage level and "VOL" corresponds to the low voltage level specification.

In an exemplary transmitter circuit, for an output swing of a voltage level, such as 500 mV, across an exemplary differential pair of transistors with 50 ohm output resistor in each branch of an exemplary differential pair of transistors, a total of 20 mA current is required. The total of 20 mA current may be calculated, based on a standard Ohm's law known in the art. In the common mode, the total current required is divided equally in both branches of the exemplary differential pair including the two load resistors such that both the branches draw 10 mA of current.

Based on the above scenario and assuming power supply to be ($V_{cc}$), which may be approximately 3.3V corresponding to the $V_{term(RX)}$ 128 of the RX circuit 104, values of the VOH and VOL may be calculated using the following mathematical expressions:

$$V_{cm} = V_{cc} - (10 \text{ mA} * 50 \text{ ohm}) = V_{cc} - 0.5V$$

$$VOH = V_{cc} - 0.25V$$

$$VOL = V_{cc} - 0.75V$$

Further, based on the above scenario, an exemplary 12 Gbps driver circuit with three pre-driver circuitries requiring 4 mA of pre-driver circuit current may be assumed. In such a case, the data rate of the exemplary driver circuit (i.e. 12 Gbps) is above the predetermined threshold value (i.e. 6 Gbps). Each of the exemplary pre-driver circuitries includes a differential pair of transistors and each branch of the load resistors requires 2 mA of current. Accordingly, the values of the VOH and VOL may be calculated using the following mathematical expression:

$$V_{cm} = V_{cc} - (10 \text{ mA} * 50 \text{ ohm}) - (2 \text{ mA} * 50 \text{ ohm})$$

$$= V_{cc} - 0.6V$$

$$VOH = V_{cc} - 0.35V$$

$$VOL = V_{cc} - 0.85V$$

Further, if the exemplary transmitter circuit is used with a standard HDMI 2.0 protocol, both the standard specifications, VOH and VOL, may be achieved. However, if the above exemplary transmitter circuit is used with another standard HDMI 1.4 protocol and the data rate of the exemplary driver circuit is below the predetermined threshold value, such as 6 Gbps, the standard specification, VOH, may not be achieved. In such a case, the standard VOH specification may be achieved with the help of an external low voltage core power supply by disconnecting the load resistors present in each branch of the differential pair of transistors in the driver circuit (illustrated in FIG. 2B).

In accordance with an embodiment, a maximum voltage drop across the two load resistors $R1_{(TX)}$ 202 and $R2_{(TX)}$ 204 present in each branch of the differential pair of the pre-driver circuit 108A may result in a VOH specification that satisfies standard protocols of one or more high-definition device interfaces between the TX circuit 102 and the RX circuit 104.

In accordance with the transmitter circuit as discussed above, for an NMOS transistor, $$V_d = VOL = V_{cc} - 0.85V$$

$$V_g = V_{cm} - (2 \text{ mA} * 50 \text{ ohm})$$

$$= V_{cc} - 0.6V - 0.1V$$

$$= V_{cc} - 0.7V$$

With the assumption that the threshold voltage ($V_{th}$) of the NMOS transistor is 0.5V, the values of $V_g$, $V_d$, and $V_{th}$ may be substituted in the mathematical expression (3), as follows:

$$V_{cc} - 0.7V < V_{cc} - 0.85V + 0.5V$$

$$V_{cc} - 0.7V < V_{cc} - 0.35V$$

Accordingly, it may be concluded that the NMOS transistors operate in a saturation region with a sufficient margin of 350 mV on the gate voltage $V_g$.

With reference to FIG. 2B, there is shown another data transmission system 200B that includes a circuit diagram of the pre-driver circuit 108A and the driver circuit 110 in the TX circuit 102 (disclosed in FIG. 1A). In FIG. 1B, each of the pre-driver circuit 108A and the driver circuit 110 further includes a plurality of circuit elements, similar to the ones described in FIG. 2A. The connections between the plurality of circuit elements are also similar to ones described in FIG. 2A.

With reference to FIG. 2B, in accordance with an embodiment, the first circuit diagram of the pre-driver circuit 108A and the driver circuit 110 may be implemented based on a second configuration of the plurality of switches S3, S21, and S22. The second configuration of the plurality of switches S3, S21, and S22 is illustrated below:

S3=ON;
S21=OFF;
S22=OFF.

In accordance with the second configuration of the plurality of switches S3, S21, and S22, the external low voltage core power supply 116 may be utilized as power supply of the pre-driver circuit 108A. Further, the combination of the pre-driver circuit 108A and the driver circuit 110, according to the second configuration, is shown by a block 228B (illustrated in FIG. 2B). An input common mode voltage of the driver circuit 110 may correspond to a second voltage value when the external low voltage core power supply 116 is used as the power supply for the pre-driver circuit 108A. The second voltage value corresponds to a voltage difference between the external low voltage core power supply 116 and sum of the voltage drop across one of the two load resistors $R1_{(TX)}$ 202 and $R2_{(TX)}$ 204 present in each branch of the differential pair of the pre-driver circuit 108A. The voltage drop across the above-mentioned resistor is due to a current provided by the external low voltage core power supply 116. The second voltage value may be given by the following mathematical expression (5):

$$V_{second}=V_{EXT}-I/2*(R2_{(RX)} 204) \text{ or}$$

$$V_{second}=V_{EXT}-I/2*(R1_{(TX)} 202) \quad (5)$$

where, $V_{second}$ corresponds to the second voltage value;

$V_{EXT}$ corresponds to the external low voltage core power supply 116;

I corresponds to the current supplied to the pre-driver circuit 108A from the external low voltage core power supply 116; and $R1_{(TX)}$ 202 and $R2_{(TX)}$ 204 correspond to the load resistors present in each branch of the differential pair of the pre-driver circuit 108A.

In accordance with an embodiment, it may be observed that the second voltage value $V_{second}$ is smaller as compared with the first voltage value $V_{first}$ when the pre-driver circuit 108A is powered from the external low voltage core power supply 116. However, when the pre-driver circuit 108A is powered by the $V_{cm}$ node 118 of the driver circuit 110, the input common mode voltage of the driver circuit 110, i.e., the first voltage value $V_{first}$ increases in comparison with the second voltage value $V_{second}$, thereby reducing the area of the driver circuit 110 (in turn, increasing the speed), providing more headroom, and reducing dynamic leakage current of the driver circuit 110. Further, the power consumption in the RX circuit 104 is also reduced for the same output swing levels.

The pre-driver circuit 108A may be powered by the external low voltage core power supply 116 when the differential resistors $R3_{(TX)}$ 212 and $R4_{(TX)}$ 216 (that act as load of the driver circuit 110) are disconnected and the VOH specification of the output of the driver circuit 110 is outside a predefined margin associated with a second operating mode of a high-definition device interface with a pre-defined specification, such as HDMI1.4.

Figure 3:
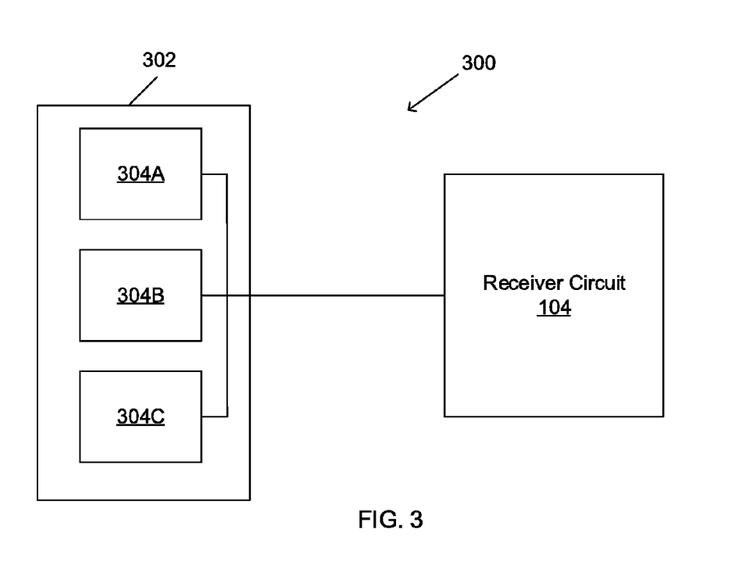
FIG. 3 illustrates a parallel implementation of multiple blocks of pre-driver and driver circuitries in an exemplary data transmission system, in accordance with an embodiment of the present disclosure.

FIG. 3 illustrates a parallel implementation of multiple blocks of pre-driver and driver circuitries in an exemplary data transmission system, in accordance with an embodiment of the present disclosure. FIG. 3 is described in conjunction with FIGS. 1A to 2B. With reference to FIG. 3, there is shown a data transmission system 300. The data transmission system 300 may include a TX circuit 302 that includes a plurality of blocks, such as three blocks 304A to 304C. Each of the three blocks 304A to 304C, represents a combination of a pre-driver circuit and a driver circuit. The pre-driver circuit in each of the three blocks 304A to 304C, may be similar to the pre-driver circuit 108A (illustrated in FIG. 1A) or pre-driver circuit 108B (illustrated in FIG. 1B). The three blocks 304A to 304C may also be functionally similar to the combination of the pre-driver circuit 108A and the driver circuit 110 represented by the block 228A (illustrated in FIG. 2A). The driver circuit in each of the three blocks 304A to 304C, may be similar to the driver circuit 110 (illustrated in FIGS. 1A to 2B). There is also shown the RX circuit 104 (illustrated in FIGS. 1A to 2B).

With reference to FIG. 3, there is shown a parallel arrangement of the three blocks 304A to 304C electrically coupled, at the output of the TX circuit 302, to the RX circuit 104, via one differential channel. In accordance with an embodiment, the above arrangement of the TX circuit 302 and the RX circuit 104 may correspond to pre-emphasis with post and pre-cursors in standard high-definition device interfaces, such as HDMI, MHL, Display Port, USB, and the like. Such an arrangement of the TX circuit 302 (that includes three blocks 304A to 304C) and the RX circuit 104 in the data transmission system 300 may result in a substantial increase in the data transmission rate from the TX circuit 302 to the RX circuit 104 due to pre-emphasis which cancels the effect of the channel loss.

Figure 4:
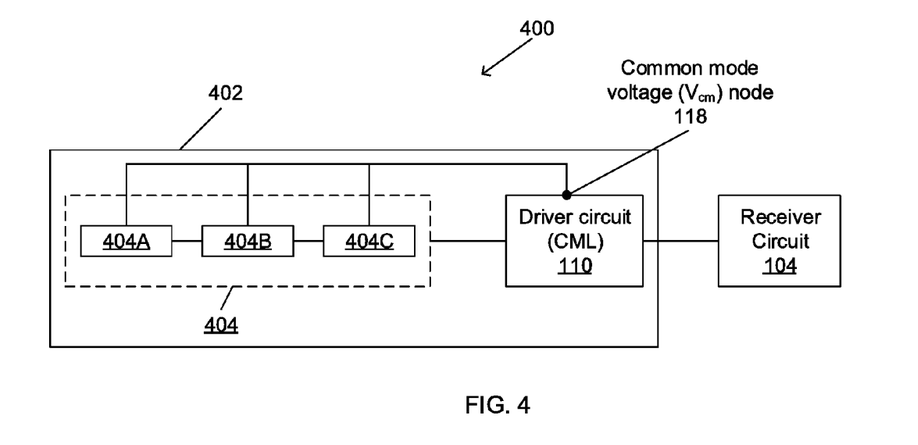
FIG. 4 illustrates a cascaded arrangement of multiple pre-driver circuitries in an exemplary data transmission system, in accordance with an embodiment of the present disclosure.

FIG. 4 illustrates a cascaded arrangement of multiple pre-driver circuitries in an exemplary data transmission system, in accordance with an embodiment of the present disclosure. FIG. 4 is described in conjunction with FIGS. 1A to 2B. With reference to FIG. 4, there is shown a data transmission system 400 that includes a TX circuit 402 which includes a cascaded arrangement 404 of multiple pre-driver circuitries. The cascaded arrangement 404 of multiple pre-driver circuitries includes a plurality of pre-driver circuitries, such as three pre-driver circuitries 404A to 404C. The TX circuit 402 includes the driver circuit 110 (illustrated in FIGS. 1A to 2B). The TX circuit 402 may be similar to the TX circuit 102 (illustrated in FIGS. 1A to 2B). The three pre-driver circuitries 404A to 404C may also be functionally similar to the pre-driver circuit 108A (illustrated in FIG. 1A). The data transmission system 400 includes the RX circuit 104 (illustrated in FIGS. 1A to 2B).

With reference to FIG. 4, the three pre-driver circuitries 404A to 404C are connected in a cascaded arrangement 404 such that the output of a first pre-driver circuit 404A is coupled with the input of a second pre-driver circuit 404B, and the output of the second pre-driver circuit 404B is coupled to the input of the third pre-driver circuit 404C. The output of the third pre-driver circuit 404C may be connected to the input of the driver circuit 110. The output of the driver circuit 110 is electrically coupled to the RX circuit 104, via a differential channel (not shown). The differential channel may be functionally similar to the differential channel 122 (illustrated in FIGS. 1A to 2B). In accordance with an embodiment, each of the cascaded three pre-driver circuitries 404A to 404C may be provided power supply by the $V_{cm}$ node 118 of the driver circuit 110 (illustrated in FIGS. 1A to 2B). The purpose of the cascading arrangement of multiple pre-driver circuitries, i.e. the three pre-driver circuitries 404A to 404C, is to provide a high boost or amplification to input signals with large bandwidth, such that the noise/loss in-between the TX circuit 402 and the RX circuit 104 does not affect the transmission of data signals via the differential channel. Also the multiple pre-driver circuitries, i.e. the three pre-driver circuitries 404A to 404C, isolate the switching noise from the circuitries preceding the pre-driver circuitries 404A to 404C to the output of the TX circuit 402.

Figure 5:
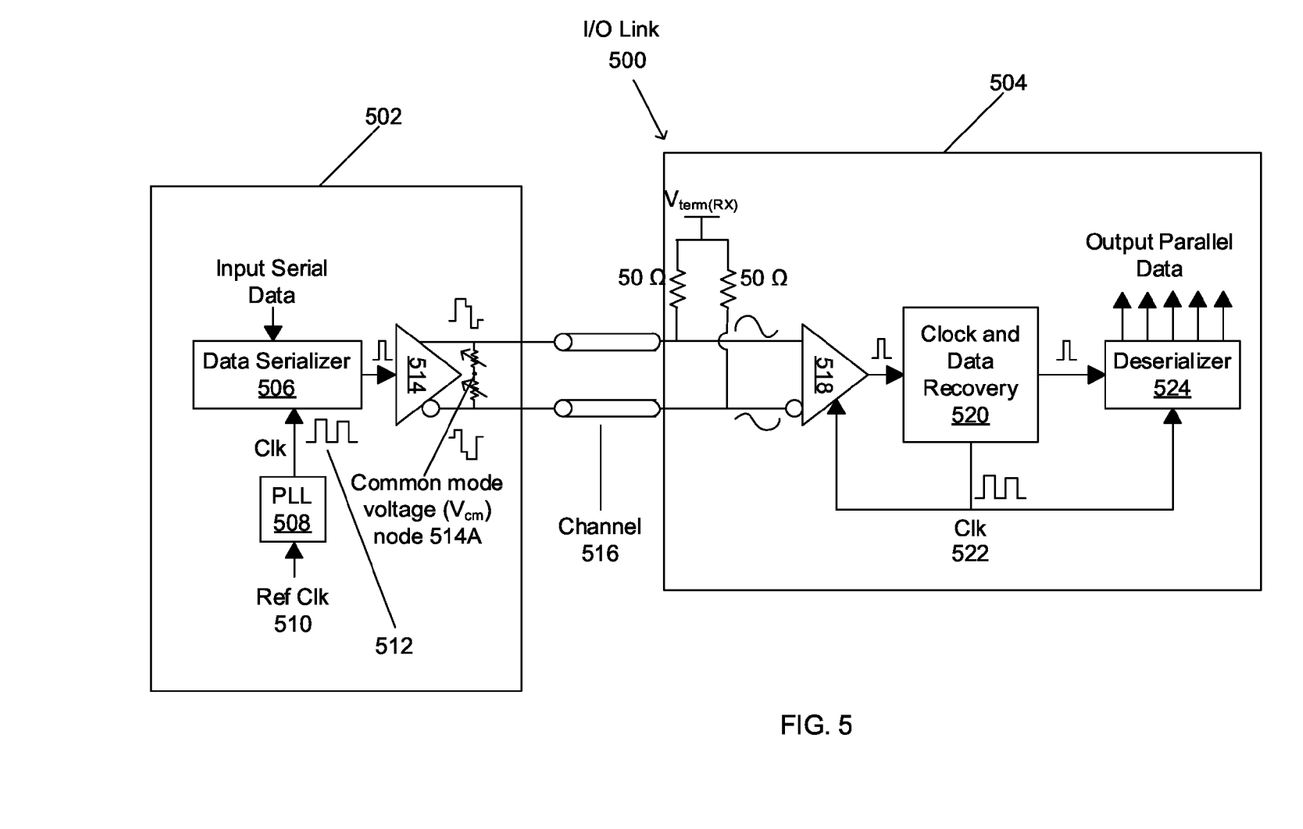
FIG. 5 illustrates a block diagram of an exemplary I/O link, in accordance with an embodiment of the present disclosure.

FIG. 5 illustrates a block diagram of an exemplary I/O link, in accordance with an embodiment of the present disclosure. With reference to FIG. 5, there is shown an I/O link 500 that includes a TX 502, a RX 504, a data serializer 506, a PLL 508, a reference clock signal 510, a clock signal 512, a driver and pre-driver circuit 514, a common mode voltage node 514A, a differential channel 516, a signal equalizer 518, a clock and data recovery element 520, and a deserializer 524. The TX 502, the RX 504, the data serializer 506, the PLL 508, and the differential channel 516 may be similar to the TX circuit 102, the RX circuit 104, the data serializer circuit 106, the PLL circuit 112, and the differential channel 122 (illustrated in FIGS. 1A and 1B). Further, the driver and pre-driver circuit 514 may be similar to the combination of the pre-driver circuit 108A or pre-driver circuit 108B and the driver circuit 110 (illustrated in FIGS. 1A and 1B). Furthermore, the common mode voltage node 514A may be similar to the common mode voltage ($V_{cm}$) node 118 (illustrated in FIGS. 1A to 2B).

With reference to FIG. 5, there is shown the TX 502 and the RX 504 electrically coupled via the differential channel 516. The data serializer 506 may receive the input parallel data and serialize the received input parallel data. The data serializer 506 may be clocked by a clock signal 512 provided by the PLL 508, which generates the clock signal 512 using the reference clock signal 510. The output of the data serializer 506, i.e. the serialized data, may be received by the driver and pre-driver circuit 514 for transmission to the RX 504, via the differential channel 516. Inside the driver and pre-driver circuit 514, the output of the driver circuit is coupled with a differential pair of resistors and one end of each of the differential pair of resistors connected at the common mode voltage node 514A. In accordance with an embodiment, the differential pair of resistors may be variable resistors, such as a potentiometer (POT).

The driver and pre-driver circuit 514 may transmit the serialized data to the RX 504, via the differential channel 516. At the RX 504, a pair of terminal resistors is connected in series with the differential channel 516 and is terminated to a power supply node $V_{term(RX)}$. The serialized data is received by a signal equalizer 518 in the RX 504. The signal equalizer 518 provides equalized data signals to a clock and data recovery element 520. The clock and data recovery element 520 provides recovered data to a deserializer 524. The clock and data recovery element 520 also provides a recovered clock signal 522 to the signal equalizer 518 and the deserializer 524. The deserializer 524 deserializes the data and produces an output parallel data.

In addition to the data transmission, as described above, the TX 502 may further harvest power from the power supply node $V_{term(RX)}$ of the RX 504 through $V_{cm}$ node in the TX 502. As a result, the TX 502 need not utilize the internal battery power, thereby saving power of the internal battery and increasing the battery life.

Figure 6:
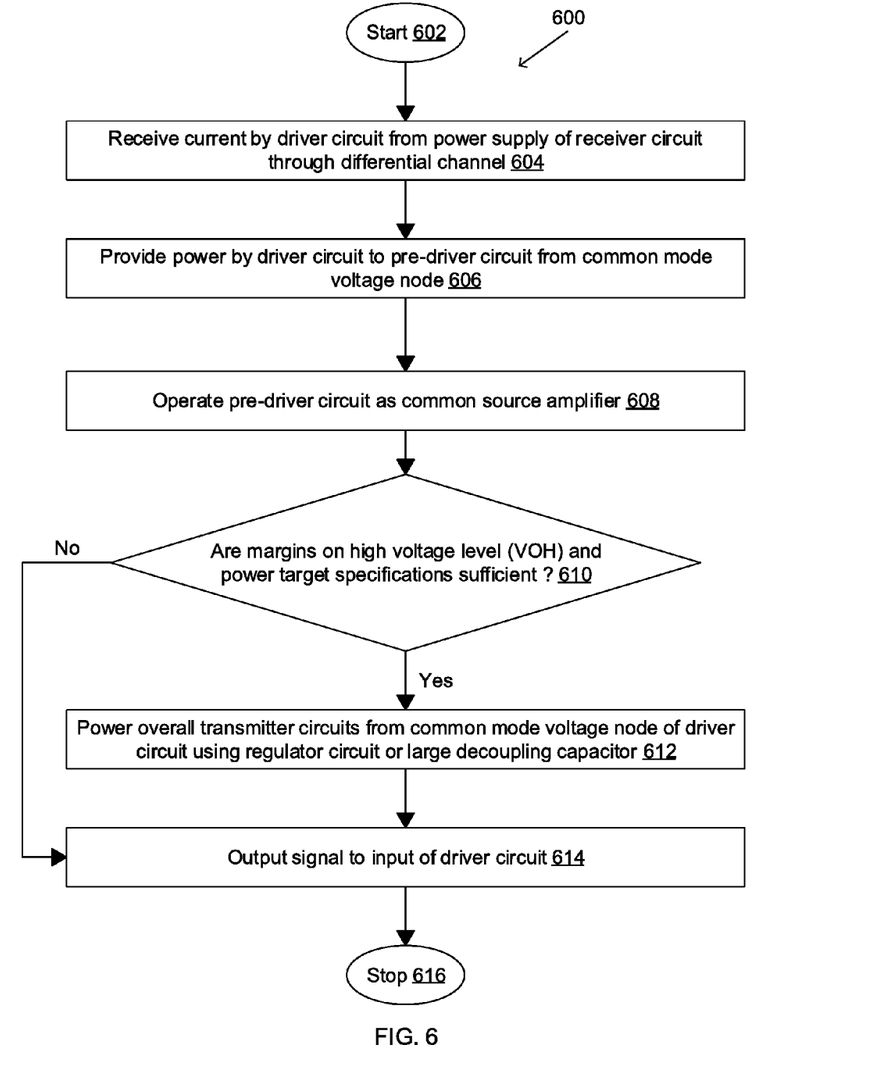
FIG. 6 is a flow chart that illustrates a method of powering a transmitter circuit, in accordance with an embodiment of the present disclosure.

FIG. 6 is a flow chart that illustrates a method of powering a transmitter circuit, in accordance with an embodiment of the present disclosure. With reference to FIG. 6, there is shown a flowchart 600 that illustrates a method of powering an exemplary transmitter circuit, such as the TX circuit 102. The method starts at step 602 and proceeds to step 604.

At step 604, current from a power supply node, such as $V_{term(RX)}$ 128, of a receiver, such as the RX circuit 104, may be received by a driver circuit, such as the driver circuit 110, in a transmitter circuit, such as the TX circuit 102. The RX circuit 104 may be coupled to the driver circuit 110 by a differential channel, such as the differential channel 122. One side of the differential channel 122 is coupled with a first pair of resistors, such as the load resistors $R3_{(TX)}$ 212 and $R4_{(TX)}$ 214 (shown in FIGS. 2A and 2B), to a common mode voltage node, such as the $V_{cm}$ node 118 of the driver circuit 110. The differential channel 122 is series terminated by a pair of terminal resistors, such as the pair of terminal resistors $R1_{(RX)}$ 124 and $R2_{(RX)}$ 126 at the RX circuit 104 to the $V_{term(RX)}$ 128.

At step 606, a pre-driver circuit, such as the pre-driver circuit 108A, may be powered by the driver circuit 110, from $V_{cm}$ node 118 of the driver circuit 110 when the VOH specification of the output of the driver circuit 110 is within a predefined margin associated with a first operating mode of a high-definition device interface with a pre-defined specification, such as HDMI2.0. In accordance with an alternative embodiment, the pre-driver circuit 108A may also be powered by external low voltage core power supply, such as the external low voltage core power supply 116, when the first pair of resistors (such as the differential pair of resistor that includes the load resistors $R3_{(TX)}$ 212 and $R4_{(TX)}$ 214 of the driver circuit 110) is disconnected and the VOH specification of the output of the driver circuit 110 is outside a predefined margin associated with a second operating mode of a high-definition device interface with a pre-defined specification, such as HDMI1.4.

At step 608, the pre-driver circuit 108A may operate as a common source amplifier. The pre-driver circuit 108A may include a differential pair of transistors, such as the two transistors $M1_{(TX)}$ 206 and $M2_{(TX)}$ 208. The differential pair of transistors operates in saturation region and a constant current flows through the pre-driver circuit 108A.

At step 610, it may be verified whether the margins on the VOH, such as the predefined margin associated with a first operating mode, and power target specifications are sufficient. In an instance, when the VOH and power target specifications are verified to be sufficient, the method proceeds to step 612. In another instance, when the VOH and the power target specifications are verified to be insufficient, the method proceeds to step 614.

At step 612, when the VOH and power target specifications are verified to be sufficient, the $V_{cm}$ node 118 of the driver circuit 110 may be used to supply a controlled power supply, such as $V_{reg}$. The $V_{reg}$ may be obtained at the output of a regulator circuit or a large decoupling capacitor, such as the regulator circuit or the large decoupling capacitor 114. Current from the $V_{reg}$ may be supplied to various transmitter circuitries that include a CMOS switching-based pre-driver circuit (such as the pre-driver circuit 108B), a data serializer circuit (such as the data serializer circuit 106), and a PLL circuit (such as the PLL circuit 112).

At step 614, the differential output from the pre-driver circuit 108A is coupled with the input of the driver circuit 110 to provide output signals to the input of the driver circuit 110. Control passes to end step 616.

The disclosed embodiments of the data transmission systems, such as 100A to 400, encompass numerous advantages. As discussed, the embodiments disclose a circuit design for powering the TX circuit 102 from the RX circuit 104 by drawing current from the $V_{term(RX)}$ 128 of the RX circuit 104. Further, the pre-driver circuitries 108A and 108B (illustrated in FIGS. 1A and 1B) are powered by the $V_{cm}$ node 118 of the driver circuit 110 (illustrated in FIG. 1A to 2B) in the TX circuit 102. Due to the powering of the pre-driver circuitries 108A and 108B by the $V_{cm}$ node 118, larger headroom for the current source present in the driver circuit 110 may be provided, thereby resulting in a decrease in the size of the driver circuit 110 and reducing the design complexity of the driver circuit 110. Additionally, the current that flows in the pre-driver circuit 108A is constant and similar to a specific power amplifier, such as "Class A type amplifier", which helps generate a stable voltage at the $V_{cm}$ node 118 of the driver circuit 110. The disclosed circuit design completely eliminates the usage of any external high voltage power supply, such as 3.3V supply, in the TX circuit 102 that may result in high power consumption in the TX circuit 102.

In accordance with an embodiment, there is disclosed a configuration in which the $V_{cm}$ node 118 of the driver circuit 110, through the regulator circuit or large decoupling capacitor 114, may also be used as power supply for various transmitter circuitries, such as the data serializer circuit 106, the PLL circuit 112, and the pre-driver circuit 108B (illustrated in FIG. 1B). The above-disclosed configuration is similar to a zero power transmitter circuit that eliminates the use of any external power supply (such as 1V or 3.3V) in the transmitter circuit (such as the TX circuit 102) of an exemplary data transmission system (such as the data transmission system 100B) (illustrated in FIG. 1B).

In accordance with an embodiment disclosed in the present disclosure, the output of the pre-driver circuitries 108A and 108B (as disclosed in FIGS. 1A and 1B) is DC, coupled to the input of the driver circuit 110 (as disclosed in FIGS. 1A to 2B). Such a DC coupling eliminates undesired loading on the pre-driver circuitries 108A and 108B thereby reducing power consumption in the TX circuit 102, compared with the AC coupling, commonly used in the prior art for designing low-power transmitter circuitries, which provides more headroom but results in an undesired loading of pre-driver circuitries.

In accordance with an embodiment disclosed in the present disclosure, due to high value of $V_{cm}$, the gate voltage $V_g$ is elevated to give sufficient head room for the cascoded current source in the driver circuit 110. Also due to high $V_{cm}$, the voltage headroom for the pre-driver circuit 108A increases. Thus with high $V_{cm}$ value, the driver circuit 110 and the pre-driver circuit 108A become less complex and designed with reduced area, thereby improving speed and power consumption in the TX circuit 102 when compared to pre-driver powered external low voltage core power supply, wherein due to insufficient headroom for the pre-driver and driver circuitries, the size of the pre-driver and driver circuitries become large and complex, thereby degrading the speed and power consumption in a standard TX.

Such a provision of the headroom of 1V provides the current source of the driver circuit 110 to be designed with a smaller area, such as an area of 0.2 mm*0.2 mm, along with an option of cascading multiple pre-driver circuitries. In contrast, with regard to the prior art, an exemplary current source for 30 mA occupies 0.5 mm*0.5 mm area with headroom of 0.2V without any option of cascading multiple pre-driver circuitries. Consequently, there is provided 6-times area benefit with 5-times impedance benefit.

In accordance with an embodiment disclosed in the present disclosure, the common mode voltage node, such as the $V_{cm}$ node 118, is a low impedance node. With reference to FIG. 1A, the pre-driver circuit 108A and the driver circuit 110 are based on CML, which results in a stable voltage across the output of the driver circuit 110 (or the TX circuit 102). Further, the common mode rejection of the driver circuit 110 ensures minimal effect of common mode glitches on the output of the driver circuit 110. Furthermore, there may be no requirement of a large decoupling capacitor for voltage stabilization in the TX circuit 102. However, if a switching circuitry was used in the TX circuit 102, a switching current would have been produced that could have caused the power supply to ripple and degrade the output of the driver circuit 110 (or the TX circuit 102). Further, in such a case, a large decoupling capacitor would be required in the switching circuitry for voltage stabilization.

In accordance with an embodiment, the low impedance of the $V_{cm}$ node 118 may be varied within the range of 50 ohm to 500 ohm. The value of the impedance of the $V_{cm}$ node 118 may vary in accordance with the data rate of the driver circuit 110, for example, 50 ohm for 12 Gbps, 100 ohm for 6 Gbps, 200 ohm for 3 Gbps, and 500 ohm for 1.5 Gbps. In an exemplary scenario, the data rate of the driver circuit 110 may be below a predetermined threshold value. Thus, the switching current in the TX circuit 102 may be small and also there may be no reflection issues in the differential channel 122. Hence, the impedance value may be 500 ohm. In another exemplary scenario, the data rate of the driver circuit 110 may be above the predetermined threshold value. Thus, the switching current in the TX circuit 102 may be high and also there may be some critical reflection issues in the differential channel 122. Hence, the impedance value may be 50 ohm.

In accordance an embodiment disclosed in the present disclosure, the power consumption of the TX circuit 102 reduces to 70 to 80 percent, as compared to a power consumption for a standard pre-driver circuit that utilizes an external power supply of 3.3V. Due to such a substantial saving of power consumption, the battery life of the TX circuit 102 is also increased.

An embodiment is an implementation or example of the disclosure. Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. It should be appreciated that in the foregoing description of exemplary embodiments of the disclosure, various features of the disclosure are sometimes grouped together in a single embodiment, figure, or description thereof for the purpose of streamlining the disclosure and aiding in the understanding of one or more of the various inventive aspects.

It will be appreciated that variants of the above disclosed, and other features and functions or alternatives thereof, may be combined into many other different systems or applications. Presently unforeseen or unanticipated alternatives, modifications, variations, or improvements therein may be subsequently made by those skilled in the art, which are also intended to be encompassed by the following claims.

The invention claimed is:

1. A transmitter (TX) circuit for data transmission over a differential channel, comprising:
   a driver circuit comprising:
      a differential transistor pair differentially coupled with the differential channel,
      a first pair of resistors, wherein one terminal of each resistor of the first pair of resistors is coupled together at a common mode voltage node, and an other terminal of each resistor of the first pair of resistors is coupled to a respective node of one of the transistors of the differential transistor pair, and
      a switch disposed between the common mode voltage node and a local power supply, wherein the switch is operable to selectively couple and decouple the local power supply and the common mode voltage node,
      wherein the differential channel is series terminated at a receiver (RX) circuit by a second pair of resistors to a power supply node of the RX circuit, wherein the differential transistor pair of the driver circuit draws current from the power supply node of the RX circuit; and
   a pre-driver circuit coupled with the driver circuit to provide an output of the pre-driver circuit as an input to the driver circuit,
      wherein at least the pre-driver circuit is powered from the common mode voltage node of the driver circuit from power drawn from the power supply node of the RX circuit over the differential channel and which flows through the first pair of resistors to the common mode voltage node when the switch is set to decouple the local power supply from the common mode voltage node, and
      wherein at least the pre-driver circuit is powered from the local power supply when the switch is set to couple the local power supply to the common mode voltage node.

2. The TX circuit of claim 1, wherein the driver circuit and the pre-driver circuit are based on Current Mode Logic (CML), wherein the common mode voltage node is a low impedance node, wherein the TX circuit corresponds to a battery operated portable electronic device and the RX circuit corresponds to a non-portable electronic device powered by an external power supply.

3. The TX circuit of claim 1, wherein the differential transistor pair in the driver circuit are in a common source configuration and further comprising a current source operable in saturation.

4. The TX circuit of claim 1, wherein the pre-driver circuit comprises another differential pair that includes two transistors in a common source configuration, wherein a constant tail current source at a common node connecting source terminals of the two transistors stabilizes voltage at the common mode voltage node of the driver circuit.

5. The TX circuit of claim 1, further comprising a regulator circuit or a large decoupling capacitor coupled to the common mode voltage node of the driver circuit, wherein the regulator circuit or the large decoupling capacitor provides a stable and controlled power supply to one or more complementary metal-oxide semiconductor (CMOS)-based switching circuitries of the TX circuit, wherein the one or more CMOS-based switching circuitries are part of a phase locked loop (PLL) circuit, a data serializer circuit and the pre-driver circuit.

6. The TX circuit of claim 1, wherein the pre-driver circuit is powered by the common mode voltage node of the driver circuit when high voltage level (VOH) specification of an output of the driver circuit is within a predefined margin associated with a first operating mode.

7. The TX circuit of claim 1, wherein the switch is operable to decouple the local power supply from the common mode voltage node and the pre-driver circuit is powered from the local power supply when a high voltage level (VOH) specification of an output of the driver circuit is outside a predefined margin associated with a second operating mode.

8. The TX circuit of claim 1, wherein a maximum voltage drop across differential resistors of the pre-driver circuit results in high voltage level (VOH) specification that satisfies standard protocols of one or more high-definition device interfaces between the TX circuit and the RX circuit.

9. The TX circuit of claim 1, wherein the driver circuit further comprises a pair of switches operable to selectively couple and decouple the differential channel from the common mode voltage node.

10. The TX circuit of claim 1, wherein:
    an input common mode voltage of the driver circuit corresponds to a first voltage value when the pre-driver circuit is powered from the common mode voltage node of the driver circuit,
    the input common mode voltage of the driver circuit corresponds to a second voltage value when the pre-driver circuit is powered from the local power supply,
    the first voltage value is greater than the second voltage value,
    the first voltage value corresponds to a difference between a terminal voltage of the RX circuit and voltage drop across a resistor in the RX circuit, the driver circuit, and the pre-driver circuit due to a terminal current provided from the power supply node of the RX circuit, and
    the second voltage value corresponds to a difference between the local power supply and voltage drop across a resistor of the pre-driver circuit.

11. A system comprising:
    a receiver (RX) circuit comprising a differential input;
    a transmitter (TX) circuit for data transmission over a differential channel coupled with the differential input of the RX circuit, comprising:
       a driver circuit comprising:
          a differential transistor pair differentially coupled with the differential channel,
          a first pair of resistors, wherein one terminal of each resistor of the first pair of resistors is coupled together at a common mode voltage node and an other terminal of each resistor of the first pair of resistors is coupled to a respective node of one of the transistors of the differential transistor pair, and
          a switch is disposed between the common mode voltage node and a power supply, wherein the switch is operable to selectively couple and decouple the power supply and the common mode voltage node,
          wherein the differential channel is series terminated at the receiver (RX) circuit by a second pair of resistors to a power supply node of the RX circuit, wherein the differential transistor pair of the driver circuit draws current from the power supply node of the RX circuit; and
       a pre-driver circuit coupled with the driver circuit to provide an output of the pre-driver circuit as an input to the driver circuit,
          wherein at least the pre-driver circuit is powered from the common mode voltage node of the driver circuit from power drawn from the power supply node of the RX circuit and which flows through the first pair of resistors to the common mode voltage node when the switch is set to decouple the common mode voltage node from the power supply, and wherein at least the pre-driver circuit is powered from the power supply when the switch is set to couple the power supply to the common mode voltage node.

12. The system of claim 11, wherein the driver circuit and the pre-driver circuit are based on Current Mode Logic (CML), wherein the differential transistor pair in the driver circuit is in a common source configuration and further comprising a current source operable in saturation.

13. The system of claim 11, wherein the pre-driver circuit comprises another differential pair that includes two transistors in a common source configuration, wherein a constant tail current source at a common node connecting source terminals of the two transistors stabilizes voltage at the common mode voltage node of the driver circuit.

14. The system of claim 11, further comprising a regulator circuit or a large decoupling capacitor coupled to the common mode voltage node of the driver circuit, wherein the regulator circuit or the large decoupling capacitor provides a stable and controlled power supply to one or more complementary metal-oxide semiconductor (CMOS)-based switching circuitries of the TX circuit, wherein the one or more CMOS-based switching circuitries correspond to a phase locked loop (PLL) circuit and a data serializer circuit and CMOS pre-drivers.

15. The system of claim 11, wherein the TX circuit further comprises: respective switches coupled in series between each transistor of the driver circuit and the common mode voltage node, configured to power the pre-driver circuit by the common mode voltage node of the driver circuit from the power supply node of the RX circuit when high voltage level (VOH) specification of an output of the driver circuit is within a predefined margin associated with a first operating mode.

16. The system of claim 11, wherein the TX circuit further comprises: respective switches coupled in series between each transistor of the driver circuit and the common mode voltage node configured to power the pre-driver circuit from the power supply when high voltage level (VOH) specification of an output of the driver circuit is outside a predefined margin associated with a second operating mode.

17. The system of claim 11, wherein a maximum voltage drop across differential resistors of the pre-driver circuit results in high voltage level (VOH) specification that satisfies standard protocols of one or more high-definition device interfaces between the TX circuit and the RX circuit.

18. A method of powering a transmitter (TX) circuit, the method comprising:

receiving, by a driver circuit in the TX circuit, current from a power supply of a receiver (RX) circuit, the RX circuit coupled to the driver circuit by a differential channel, wherein one side of the differential channel is coupled through a first pair of resistors to a common mode voltage node of the driver circuit, wherein the differential channel is series terminated by a second pair of resistors at the RX circuit to a power supply node;

powering, by the driver circuit, at least a pre-driver circuit from the common mode voltage node from power drawn from the power supply node of the RX circuit and which flows through the first pair of resistors to the common mode voltage node when the common mode voltage node is decoupled from a local power supply;

powering at least the pre-driver circuit from the local power supply when the local power supply is coupled to the common mode voltage node;

operating the pre-driver circuit as a common source amplifier; and outputting a signal from the pre-driver circuit as an input to the driver circuit.

19. The method of claim 18, further comprising:

powering, by the driver circuit, the pre-driver circuit from the common mode voltage node of the driver circuit when high voltage level (VOH) specification of an output of the driver circuit is within a predefined margin associated with a first operating mode.

20. The method of claim 18, further comprising:

powering the pre-driver circuit from an external low voltage core power supply when the first pair of resistors is disconnected and high voltage level (VOH) specification of an output of the driver circuit is outside a predefined margin associated with a second operating mode.

* * * * *